(12) United States Patent
Harig et al.

(10) Patent No.: US 8,940,367 B2
(45) Date of Patent: Jan. 27, 2015

(54) COATING DEVICE AND COATING METHOD

(75) Inventors: Tino Harig, Langelsheim (DE); Markus Höfer, Gardessen (DE); Artur Laukart, Braunschweig (DE); Lothar Schäfer, Meine (DE); Markus Armgardt, Braunschweig (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 605 days.

(21) Appl. No.: 13/375,938

(22) PCT Filed: May 13, 2010

(86) PCT No.: PCT/EP2010/056621
§ 371 (c)(1),
(2), (4) Date: Jan. 4, 2012

(87) PCT Pub. No.: WO2010/139541
PCT Pub. Date: Dec. 9, 2010

(65) Prior Publication Data
US 2012/0135144 A1 May 31, 2012

(30) Foreign Application Priority Data
Jun. 2, 2009 (DE) .......................... 10 2009 023 472

(51) Int. Cl.
*C23C 16/00* (2006.01)
*C23C 16/22* (2006.01)
(Continued)

(52) U.S. Cl.
CPC ................ *C23C 16/22* (2013.01); *C23C 16/24* (2013.01); *C23C 16/26* (2013.01); *C23C 16/44* (2013.01); *C23C 16/4405* (2013.01); *C23C 16/52* (2013.01)
USPC .............. 427/248.1; 427/255.28; 427/255.35; 118/715; 118/722; 118/723 HC

(58) Field of Classification Search
CPC .. C23C 16/4401; C23C 16/24; C23C 16/325; C23C 16/42; C23C 16/4557
USPC ............................. 427/248.1, 255.28, 255.35; 118/715–733
See application file for complete search history.

(56) References Cited

U.S. PATENT DOCUMENTS

| 2,637,297 A | 5/1953 | Shapiro ........................... 118/49 |
| 6,593,548 B2 * | 7/2003 | Matsumura et al. .......... 219/390 |

(Continued)

FOREIGN PATENT DOCUMENTS

| EP | 1 258 914 A1 | 11/2002 | ............ H01L 21/205 |
| EP | 2098608 A1 | 9/2009 | .............. C23C 14/04 |

(Continued)

OTHER PUBLICATIONS

Korean Office Action dtd Jun. 5, 2013—Notice of Preliminary Rejection.

(Continued)

*Primary Examiner* — Elizabeth Burkhart
(74) *Attorney, Agent, or Firm* — Brinks Gilson & Lione

(57) ABSTRACT

A coating installation includes at least one recipient which can be evacuated and which is provided to receive a substrate, at least one gas supply device which can introduce at least one gaseous precursor into the recipient, and at least one activation device which contains at least one heatable activation element, the end thereof being secured to a securing point on a support element. A shielding element which can protect at least the securing point at least partially against the effect of the gaseous precursor is provided. The shielding element has a longitudinal extension having a first side and a second side, the first side being arranged on the support element and a locking element being arranged on the second side of the shielding element, the locking element having at least one outlet. At least one separation wall is arranged inside the shielding element, the wall separating the inner volume of the shielding element into a first partial volume and into a second partial volume.

20 Claims, 2 Drawing Sheets

(51) Int. Cl.
*C23C 16/24* (2006.01)
*C23C 16/26* (2006.01)
*C23C 16/44* (2006.01)
*C23C 16/52* (2006.01)

(56) References Cited

U.S. PATENT DOCUMENTS

| 2004/0065260 A1 | 4/2004 | Ishibashi et al. ............. 118/724 |
| 2007/0128861 A1 | 6/2007 | Kim et al. ..................... 438/680 |
| 2008/0095937 A1 | 4/2008 | Richardson et al. ..... 427/255.24 |

FOREIGN PATENT DOCUMENTS

| JP | 07254566 A | 10/1995 | ............ H01L 21/205 |
| JP | 2009-038398 | 2/2009 | ............ H01L 21/205 |
| WO | WO 02/25712 A1 | 3/2002 | ............ H01L 21/84 |

OTHER PUBLICATIONS

Honda et al., Study of Silicidation Process of Tungsten Catalyzer during Silicon Film Deposition in Catalytic Chemical Vapor Deposition, 2008, pp. 3692-3698, vol. 47, No. 5, Japanese Journal of Applied Physics.

Frigeri, P.A. et al., Hot Wire Chemical Vapor Deposition: Limits and Opportunities of Protecting the Tungsten Catalyzer from Silicide with a Cavity, 2009, pp. 3428-3429, Elsevier.

Haubner, R. et al., Diamond Growth by Hot-Filament Chemical Vapor Deposition: State of the Art, 1993, pp. 1277-1294, Elsevier Sequoia.

Matsumura, Hideki et al., Recent Progress of Cat-CVD Research in Japan—Bridging Between the First and Second Cat-CVD Conferences, 2003, pp. 7-14, Elsevier.

* cited by examiner

COATING DEVICE AND COATING METHOD

BACKGROUND

The invention relates to a coating device, comprising at least one evacuable recipient which is intended for receiving a substrate, at least one gas supply device, by means of which at least one gaseous precursor can be introduced into the recipient, and at least one activation device which comprises at least one heatable activation element, the end of which is fastened to a holding element at a fastening point, wherein a shielding element is present, by means of which at least the fastening point can be protected at least partially against the action of the gaseous precursor, the shielding element being of essentially cylindrical design, and there being arranged on that side of the shielding element which faces away from the holding element a closing element which has at least one outlet port. The invention relates, furthermore, to a corresponding coating method.

Coating devices of the type mentioned are intended, according to the prior art, for coating a substrate by means of hot wire-activated chemical vapor deposition. The deposited layers may comprise, for example, carbon, silicon or germanium. The gaseous precursors may correspondingly comprise, for example, methane, silicon tetrahydride, monogermanium, ammonia or trimethyl silane.

It is known from P. A. Frigeri et al.: "Hot Wire Chemical Vapour Deposition: Limits and Opportunities of protecting the tungsten catalyzer from silizide with a cavity", Thin Solid Films Vol. 517, Iss. 12 (2009) 3427, that an undesirable reaction of the material of the activation element with the precursor takes place particularly at the relatively cold clamping points of the activation element. For example, the use of a silane compound as precursor may lead to the formation of silicide phases on the activation element. These silicide phases modify the electrical resistance, the surface quality and the mechanical load-bearing capacity of the activation element, and therefore, this often has to be exchanged after only brief use.

To solve this problem, said prior art proposes to protect a region around the clamping points of the wire used as activation element against the action of the precursor by means of a cylindrical high-grade steel element with a diameter of 4 mm and with a length of 90 mm. The service life of the activation element is thereby to be prolonged. Although the prior art shows such a prolongation of the service life, this is nevertheless still insufficient during long-lasting coating methods or for carrying out a plurality of shorter coating methods one immediately after the other.

Therefore, the object of the invention is to prolong the service life of an activation element in a coating device for hot wire-activated chemical vapor deposition.

SUMMARY

According to the invention, it is proposed to introduce a substrate to be coated into an evacuable recipient in a way known per se. The recipient is in this case composed, for example, of aluminum, high-grade steel, ceramic and/or glass. At least one gaseous precursor is introduced via at least one gas supply device into the recipient at a predeterminable partial pressure. For example, the precursor may comprise methane, silanes, germaniums, ammonia, trimethylsilane, oxygen and/or hydrogen.

For depositing a layer, an activation element arranged in the inner space of the recipient is heated. In particular, the heating of the activation element may take place by means of electron impact heating or electrical resistance heating. The activation element comprises essentially a refractory metal, such as, for example, molybdenum, niobium, tungsten or tantalum or an alloy of these metals. In addition, the activation element may comprise further chemical elements which either constitute unavoidable impurities or, as an alloying constituent, adapt the properties of the activation element to the desired properties. The activation element may be designed in the form at least of a wire, a cylinder, a tube or a sheet. Further geometric configurations may be envisaged as the case may be.

The activation element is part of an activation device which may comprise, furthermore, at least one holding element and/or at least one current feed device and/or at least one contact element and/or at least one shielding element and/or further elements.

The molecules of the gaseous precursor are split and/or excited on the surface of the activation element. Excitation and/or splitting may involve a step which takes place under the influence of heterogeneous catalysis on the surface of the activation element. The molecules thus activated it pass onto the surface of the substrate and form the desired coating there. To enlarge the surface of the activation element, the latter may comprise one or more wires. In addition, the activation element may comprise further geometric elements, such as plates, sheets or cylinders.

The ends of the activation element are fastened to at least one holding element by means of at least one fastening point. Fastening may take place, for example, by clamping, welding or spring tension. On account of the increased thermal conductivity and/or increased heat radiation of the holding element, the activation element may have a lower temperature in a portion in the vicinity of the fastening point, as compared with a portion which is at a greater distance from the fastening point. In this case, the temperature of the activation element may fall at the fastening point or in its vicinity to an extent such that the material of the activation element undergoes chemical reaction with the precursor. For example, a tungsten-comprising activation element may form with a silicon-comprising precursor a tungsten silicide phase.

In order to protect the fastening point and/or a portion of the activation element in the vicinity of the fastening point at least partially against the action of the gaseous precursor, according to the invention a shielding element is proposed. A portion of the activation element which is located in the vicinity of the fastening point is understood according to the invention to mean a subsurface or subsection of the activation element wherein the temperature of the activation element falls below the limit temperature at which the dissociation and/or excitation reaction required for coating no longer takes place or the material of the activation element undergoes chemical reaction with the precursor. This may be, for example, a temperature of less than 2000° C., of less than 1800° C., of less than 1500° C. or of less than 1300° C. The geometric extent of this subsurface or subsection may be dependent upon the heating power supplied and the heat discharged via the holding element. Heat discharge via the holding element may be dependent upon the cross section and/or surface of the latter. At least partial protection against the action of the gaseous precursor is assumed, according to the invention, when the partial pressure of the gaseous precursor is lower within the shielding element than in the space outside the shielding element. The partial pressure may be determined, for example, by measurement or by simulation calculation.

The shielding element has essentially cylindrical geometry, and in this case the cross section of the cylinder may be polygonal or round. A round cross section may have a constant or partially variable curvature. The longitudinal extent of the cylinder may be smaller than, larger than or equal to its diameter. The cross section of the cylinder may be constant or variable. In particular, for the purposes of the present invention, the mathematical forms of a prism, of a parallelepiped, of a cone or of a cube are also considered to be cylindrical.

In one embodiment of the invention, the cylindrically designed shielding element may be arranged such that the longitudinal axis is arranged essentially parallel to the longitudinal axis of the activation element. The base of the shielding element may be arranged, essentially gas-tight, on the holding element.

According to the invention, on that side of the shielding element which faces away from the holding element, a closing element is arranged which shields the inner space of the shielding element in the manner of a cover. In this case, the closing element has an outlet port through which the activation element reaches the free volume of the recipient from the fastening point.

In a development of the invention, the longitudinal extent of the shielding element is enlarged to an extent such that even a subsection of the activation element which has or exceeds the minimum temperature required for activating the gas phase is arranged in the inner space of the shielding element. A small quantity of the gaseous precursor which penetrates into the inner volume of the shielding element can thereby be activated, so that the molecules which have reacted in this way no longer undergo reaction with the activation element at the fastening point or in the vicinity of the fastening point.

The shielding element may have at least one partition which separates the inner volume of the shielding element into a first subvolume and a second subvolume. The overflow of the gaseous precursor from the free volume of the recipient to the fastening point or into the vicinity of the fastening point of the activation element can thereby be further reduced.

In some embodiments of the invention, the shielding element may have a variable cross section along its longitudinal axis. Thus, for example, a first subvolume of the shielding element which has to surround a construction space for mechanical fastening of the activation element to the holding element may be designed to have a larger bulk than a subvolume which is further away from the fastening point and which merely has to receive the activation element. The partial pressure of the precursor at the fastening point can thereby be reduced.

Since the situation cannot be ruled out in all the embodiments of the invention where the inner surface of the boundary wall of the shielding element is permanently contaminated with layer-forming substances from the gaseous precursor, in one embodiment of the invention there may be provision for part of the shielding element to be connected separably to the holding element. The separable part of the shielding element can thereby be replaced in an especially simple way when the inner space of the shielding element is heavily soiled and has therefore reached the end of its service life. For example, the shielding element may always be exchanged together with the activation element.

For a further reduction in the partial pressure of the gaseous precursor which may lead to a further prolongation of the service life of the activation element, the inner volume of the shielding element may issue into a gas discharge port which is connectable to a vacuum pump. The precursor can thus be discharged from the inner space of the shielding element quickly and reliably.

A further improvement in the discharge of the precursor is obtained when the inner volume of the shielding element has, furthermore, a gas supply port through which a reactive gas and/or an inert gas can be introduced. A pumping gas stream can thus be formed which increases the absorbency for the gaseous precursor. Moreover, a reactive gas may be provided for reacting with the precursor, so that the precursor is subsequently no longer available for reaction with the material of the activation element. Furthermore, the reactive gas may form a protective layer on the activation element. It should be pointed out that, when the coating device is in operation, the reactive gas and/or inert gas introduced into the inner space of the shielding element leaves the inner volume of the shielding element predominantly through the gas discharge port and does not pass into the free volume of the evacuable recipient through the outlet ports.

Alternatively or additionally to the described use of a mechanical vacuum pump, the partial pressure of the precursor may be reduced by means of a sorption material arranged in the inner space of the shielding element. For example, a zeolite and/or a metal foam and/or a titanium film may be used for this purpose. To increase the absorbency of the sorption material, the surface of the sorption material may be enlarged by the introduction of ribs or joints. Furthermore, an increase in the absorbency of the sorption material may be obtained by the shielding element being heated or cooled. A titanium film can be renewed continuously or cyclically by cathode sputtering or thermal evaporation when the coating device is in operation.

In some embodiments of the invention, there may be provision for the shielding element to be arranged so as to be insulated electrically with respect to the holding element and/or to the activation element. In this case, a plasma discharge can be ignited between the activation element and the shielding element and/or between the holding element and the shielding element by a direct or alternating voltage being applied. The plasma discharge can be used for converting molecules of the gaseous precursor into other compounds which no longer react or react more slowly with the material of the activation element or form a protective layer on the activation element in the region of the fastening point.

BRIEF DESCRIPTION OF THE DRAWINGS

The invention will be explained in more detail below by means of exemplary embodiments and figures, without the general idea of the invention being restricted. In the figures.

DESCRIPTION OF PREFERRED EMBODIMENTS

Figure 1:
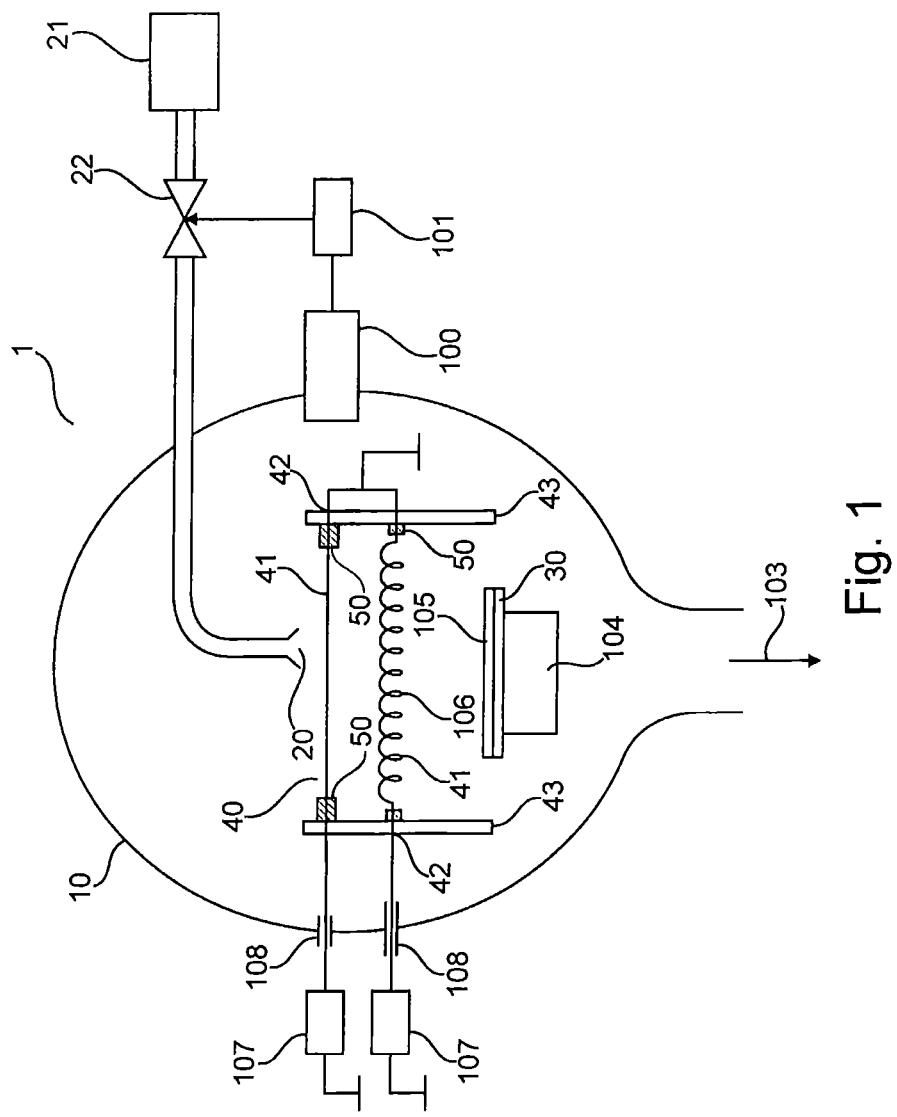
FIG. 1 shows the basic set-up of a coating device according to the invention.

FIG. 1 shows a cross section through a coating device 1. The coating device 1 comprises a recipient 10 which is produced, for example, from high-grade steel, aluminum, glass or a combination of these materials. The recipient 10 is closed off, essentially air-tight, with respect to the surroundings. A vacuum pump, not illustrated, may be connected via a pump flange 103. For example, the recipient 10 may be evacuated to a pressure of less than $10^0$ mbar, of less than $10^{-2}$ mbar or of less than $10^{-6}$ mbar.

Located inside the recipient 10 is a holding device 104 on which a substrate 30 can be held. The substrate 30 may be composed, for example, of gas, silicon, plastic, ceramic, metal or an alloy. For example, the substrate may be a semiconductor wafer, a disk or a tool. It may have a planar or curved surface. Said materials are in this case mentioned merely by way of example. The invention does not teach the use of a specific substrate as a principle of the solution. When the coating device 1 is in operation, a coating 105 is deposited on the substrate 30.

The composition of the coating 105 is influenced by the choice of the gaseous precursor. In one embodiment of the invention, the precursor may comprise methane, so that the coating 105 comprises diamond or diamond-like carbon. In another embodiment of the invention, the precursor may comprise silicon tetrahydride and/or monogermanium, so that the coating comprises crystalline or amorphous silicon and/or germanium.

The gaseous precursor is introduced into the interior of the recipient 10 via at least one gas supply device 20. The gas supply device 20 obtains the gaseous precursor from a reservoir 21. The quantity of precursor extracted from the reservoir 21 is influenced via a regulating valve 22. Insofar as the coating 105 is composed of a plurality of different precursors, the reservoir 21 may comprise a prepared gas mixture or else a plurality of gas supply devices may be provided which in each case introduce a component of the composite precursor into the recipient 10.

The quantity of the precursor supplied via the regulating valve 22 of the gas supply device 20 is controlled via a regulating device 101. The regulating device 101 is supplied with an actual value of a partial or absolute pressure by a measuring device 100.

At least one activation device 40 is available for activating the gaseous precursor. The activation device comprises at least one heatable activation element 41. The activation element 41 comprises one or more catalytically active surfaces, for example in the form of a sheet, a tube or a wire. For example, the activation device 40 may comprise two wires 41 which have in each case a catalytically active surface. For example, the wires 41 may comprise tungsten, niobium, molybdenum and/or tantalum. The wires 41 may be stretched straight or be formed by means of a plurality of turns 106, with the result that the active surface of the wire 41 is further enlarged.

The activation element 41 is fastened to at least one holding element 43 at at least one fastening point 42. The at least one holding element 43 fixes the activation element 41 in a predeterminable position and with a predeterminable mechanical tension.

The catalytic activity of the surface of the activation elements 41 is achieved at a temperature which is increased with respect to room temperature. To heat the activation elements 41, there is provision, according to FIG. 1, for at least one end of an activation element 41 to be connected to a current source 107 by means of a vacuum-tight leadthrough 108. In this case, the activation element 41 is heated by resistance heating.

On account of the thermal conduction and/or heat radiation of the holding elements 43 which are at a lower temperature, the temperature of the activation element 41 decreases from the geometric center toward the margin when the heating power is essentially constant over the length of the activation element. In this case, in the vicinity of the fastening point 42, a temperature arises at which the material of the activation element 41 may react with the gaseous precursor to form undesirable phases, for example carbides and/or silicides.

In order to reduce the ingress of the gaseous precursor into this colder region of the activation element 41, according to the invention a shielding element 50 is provided at the fastening points 42. The shielding element 50 is fastened to the holding elements 43 on one side.

Figure 2:
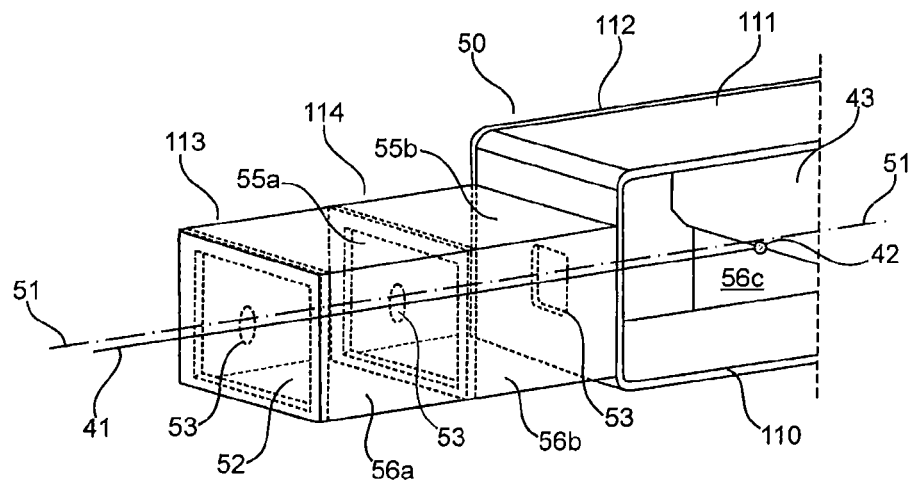
FIG. 2 illustrates one possible embodiment of the shielding element proposed according to the invention.

FIG. 2 shows an exemplary embodiment of a shielding element 50. Part of the holding element 43 is illustrated in the right part of FIG. 2. Located on the holding element 43 is a fastening point 42 of an activation element 41 which is formed essentially from a wire.

The fastening point 42 is surrounded by a box-shaped housing which is formed from a lower boundary wall 110, an upper boundary wall 111, an end wall 55b and two side walls 112. In order to make the inner space 56c of the housing visible, only one side wall 112 is illustrated in FIG. 2. In the exemplary embodiment according to FIG. 2, the upper boundary wall 111, the end wall 55b and the lower boundary wall 110 are produced in one piece from a single sheet metal strip. The first housing consequently has a rectangular or square horizontal projection with rounded corners. Other structural possibilities may, of course, also be adopted, for example the shielding element 50 may be produced rotationally symmetrically as a lathe-turned part.

The axis of symmetry 51 of the box-shaped housing runs approximately parallel to the activation element 41. In some embodiments of the invention, the axis of symmetry 51 may coincide with the activation element 41.

Located in the end wall 55b is an outlet port 53 through which the activation element 41 is led from the fastening point 42 into the free volume of the recipient 10.

In order to reduce further the solid angle element from which the entry of molecules of the precursor is possible, the shielding element 50 has further box-shaped housing parts 113 and 114. The housing parts 113 and 114 have a rectangular cross section. However, a person skilled in the art will recognize that in this case, too, another geometric cross section may be chosen. In particular, the cross section may be polygonal or round. The housing parts 113 and 114 are subdivided via a partition 55a, so that two subvolumes 56a and 56b are formed. The partition 55a, too, has an outlet port 53 in order to allow the unimpeded outlet of the activation element 41. The housing 113 is closed off with respect to the free volume of the recipient 10 by means of a closing element 52. The closing element 52, too, is provided with an outlet port 53.

When the coating device 1 is in operation, the activation element 41 of the activation device 40 can be heated such that the surface temperature required for the catalytic decomposition of the gaseous precursor is reached at least in the subvolume 56a of the shielding element 50. In the subvolumes 56b and 56c, the temperature of the activation element 41 then falls to the temperature of the holding element 43. Insofar as molecules of the precursor enter the volume 56a through the ports 53 or 54, they impinge there with high probability against the partition 55a or a boundary surface of the housing part 113. In this case, the molecules either can leave the volume 56a again via one of the ports 53 or 54 or are absorbed by the correspondingly equipped housing material of the housing part 113. Insofar as a molecule impinges against the activation element 41, it is dissociated or activated on account of the high temperature of the activation element 41, this mostly leading to the coating of the walls delimiting the volume 56a. This does not entail damage to the activation element 41 in the volume 56a on account of the high temperature of the activation element 41.

By virtue of the above-described action of the first housing part 113, the partial pressure of the precursor in the inner volume 56b of the second housing part 114 is lowered with respect to the free volume of the recipient 110. A further reduction of the partial pressure then takes place inside the second volume 56*b*, as described above.

Since, then, only a small number of molecules reach the subvolume 56*c*, the partial pressure of the precursor is minimal inside the volume 56*c*. At the same time, located inside the subvolume 56*b* and/or 56*c* is that portion of the activation element 41 wherein the temperature falls below the limit value at which damage to the activation element 41 becomes probable. Undesirable reaction of the activation element with the precursor may therefore take place in this region. On account of the lowered partial pressure, the undesirable reaction of the material of the activation element 41 with the precursor in the inner volume 56*c* of the activation element 50 is, however, lowered, as desired, and the service life of the activation element 41 is increased.

Figure 3:
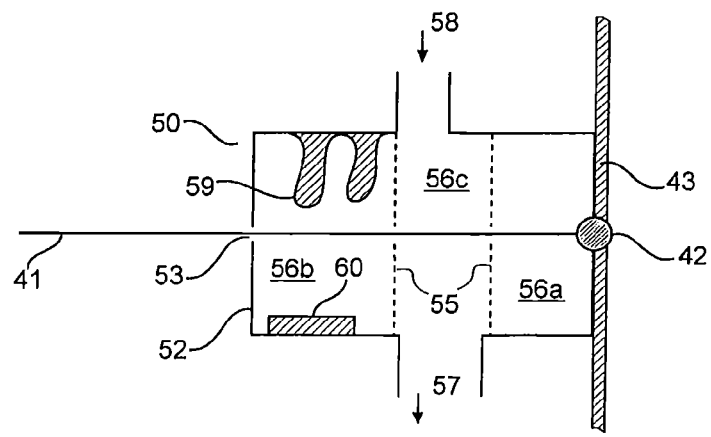
FIG. 3 shows a cross section through a further embodiment of the shielding element according to the present invention.

FIG. 3 shows a further exemplary embodiment of the shielding element 50. A detail of a holding element 43 is again illustrated in the right part of the figure. A fastening point 42 of an activation element 41 is located on the holding element 43. The fastening point 42 is surrounded by a shielding element 50, the basic form of which may be, for example, a cylinder, a parallelepiped or a prism. In the inner space 56 of the shielding element 50, the temperature of the activation element 41 falls from a value suitable for activating the precursor to the temperature of the holding element 43. In order to keep the partial pressure of the gaseous precursor in the inner space 56 of the shielding element 50 as low as possible, the inner space 56 is closed off with respect to the recipient 10 by means of a closing element 52. Located in the closing element 52 is an outlet port 53 through which the activation element can emerge.

The inner space 56 is subdivided by at least one partition 55. FIG. 3 illustrates two partitions 55 which give rise to three subvolumes 56*a*, 56*b* and 56*c*. The number of partitions 55 may be larger or smaller in different embodiments of the invention. The partitions 55 are therefore illustrated in FIG. 3 as dashed lines.

In order to reduce the partial pressure of the precursor in the inner space 56, various measures are taken to remove molecules entering through the outlet port 53 from the inner space 56. For example, there may be provision for removing the molecules from the inner space 56*c* through a gas discharge port 57 by means of a vacuum pump. The type of vacuum pump used will be adapted by a person skilled in the art to the desired total pressure inside the volume 56*c*. For example, a rotary slide pump, a scroll pump, a diffusion pump, a turbomolecular pump, a cryogenic pump or a combination of a plurality of pumps may be used.

In order to increase the pumping power, there may be provision for introducing an inert gas and/or a reactive gas into the inner space 56*c* through a gas supply port 58. An inert gas may be provided, in particular, for maintaining in the volume 56*c* a gas stream which entrains the undesirable molecules of the precursor and removes them from the volume 56*c*. In addition, a reactive gas can exert further actions for prolonging the service life of the activation element 41. For example, the reactive gas can form a protective layer on the colder portion of the activation element 41. Furthermore, the reactive gas can react with the molecules of the precursor and at the same time convert these into a compound which reacts at least more slowly with the material of the activation element 41.

Additionally or alternatively to the gas supply port 58 and/or to the gas discharge port 57, the partial pressure in the volume 56*a* may also be lowered in that a material which binds the precursor is used for the housing wall of the shielding element 50. In order to provide a sufficiently large surface, there may be provision, for this purpose, for forming ribs 59 inside the volume 56*a*. These may cover a subsurface or the entire surface of the inner wall of the shielding element 50.

Furthermore, there may be provision for, at least one subsurface of the boundary wall of the shielding element 50 to be coated or covered with a layer 60 of a sorption material or getter material. The wall of the shielding element 50 thus forms a sink for the precursor, so that the partial pressure of the precursor falls inside the volume 56*a*. The interaction of the precursor with the colder portions of the activation element 41 is thereby reduced, so that the service life of the activation element 41 is prolonged, as desired.

No further measures for lowering the partial pressure are taken in the subvolume 56*a*. However, entering molecules may react with the inner wall of the shielding element 50 or be precipitated there.

The arrangement of gas supply ports 58 and/or gas discharge ports 57 and/or layers 60 of a sorption material and/or ribs 59 in the subvolumes 56*a*, 56*b* and 56*c* is illustrated merely by way of example. In other embodiments of the invention, one or more identical or different devices for lowering the partial pressure of the precursor may be arranged in a single subvolume or even be omitted.

Of course, the features illustrated in FIGS. 2 and 3 with regard to the shielding element 50 may be combined in order thereby to obtain further embodiments of the shielding element according to the invention and of the coating device according to the invention. The above description is therefore not to be considered as restrictive, but as explanatory. The following claims are to be understood such that a feature which is specified is present in at least one embodiment of the invention. This does not rule out the presence of further features. Insofar as the claims define "first" and "second" features, this designation serves for distinguishing two identical features, without stipulating an order of preference.

The invention claimed is:

1. A coating device, comprising at least one evacuable recipient which is adapted to receive a substrate, at least one gas supply device, by means of which at least one gaseous precursor can be introduced into the recipient, and at least one activation device which comprises at least one heatable activation element, the end of which is fastened to a holding element at a fastening point, a shielding element being present, by means of which at least the fastening point can be protected at least partially against the action of the gaseous precursor, the shielding element having a longitudinal extent with a first side and with a second side, the first side being arranged on the holding element, and there being arranged on the second side of the shielding element a closing element which has at least one outlet port, wherein at least one partition is arranged inside the shielding element and separates the inner volume of the shielding element into a first subvolume and a second subvolume.

2. The coating device according to claim 1, wherein the shielding element comprises a variable cross section along its longitudinal axis.

3. The coating device according to claim 1, wherein at least a part of the shielding element is coupled separably to the holding element.

4. The coating device according to claim 1, wherein the shielding element comprises further a gas discharge port which is connectable to a vacuum pump.

5. The coating device according to claim 4, wherein the shielding element comprises further a gas supply port through which a reactive gas and/or an inert gas can be introduced.

6. The coating device according to claim 1, wherein the shielding element is insulated electrically from the holding element and/or from the activation element.

7. The coating device according to claim 1, wherein the shielding element comprises further ribs on its inside.

8. The coating device according to claim 1, wherein the shielding element is provided with a sorption material.

9. The coating device according to claim 8, wherein the sorption material comprises any of a zeolite and/or a metal foam and/or a titanium film.

10. The coating device according to claim 1, wherein the shielding element is heatable.

11. A coating device, comprising at least one evacuable recipient which is adapted to receive a substrate, at least one gas supply device, by means of which at least one gaseous precursor can be introduced into the recipient, and at least one activation device which comprises at least one heatable activation element, the end of which is fastened to a holding element at a fastening point, a shielding element being present, by means of which at least the fastening point can be protected at least partially against the action of the gaseous precursor, the shielding element having a longitudinal extent with a first side and with a second side, the first side being arranged on the holding element, and there being arranged on the second side of the shielding element a closing element which has at least one outlet port, wherein at least one partition is arranged inside the shielding element and separates the inner volume of the shielding element into a first subvolume and a second subvolume, and wherein the shielding element comprises a variable cross section along its longitudinal axis.

12. The coating device according to claim 11, wherein the shielding element comprises further a gas discharge port which is connectable to a vacuum pump and a gas supply port through which a reactive gas and/or an inert gas can be introduced.

13. The coating device according to claim 11, wherein the shielding element is insulated electrically from the holding element and/or from the activation element.

14. The coating device according to claim 11, wherein the shielding element comprises further ribs on its inside.

15. A method for producing a coating of a substrate, wherein the substrate is introduced into an evacuable recipient, at least one gaseous precursor is introduced into the recipient via at least one gas supply device and is activated by means of at least one activation device which comprises at least one heatable activation element, the end of which is fastened to a holding element at a fastening point, a shielding element being present, by means of which at least the fastening point is protected at least partially against the action of the gaseous precursor, the shielding element having a longitudinal extent with a first side and with a second side, the first side being arranged on the holding element, and there being arranged on the second side of the shielding element a closing element which has at least one outlet port, wherein the shielding element has at least one partition which separates the inner volume of the shielding element into a first subvolume and a second subvolume.

16. The method according to claim 15, wherein the shielding element is heated.

17. The method according to claim 15, wherein an inert gas and/or a reactive gas is introduced at least in a subvolume of the inner volume of the shielding element.

18. The method according to claim 15, wherein at least one subvolume of the inner volume of the shielding element is evacuated.

19. The method according to claim 15, wherein a gas discharge is ignited at least in a subvolume of the inner volume of the shielding element.

20. The method according to claim 15, wherein at least one subsurface of an inner surface of the shielding element is provided with a sorption material.

* * * * *